United States Patent
Werner, Jr.

(10) Patent No.: US 6,426,630 B1
(45) Date of Patent: Jul. 30, 2002

(54) ELECTROSTATIC VOLTMETER WITH CURRENT SOURCE LOAD

(75) Inventor: Alan J. Werner, Jr., Rochester, NY (US)

(73) Assignee: Xerox Corporation, Stamford, CT (US)

( * ) Notice: Subject to any disclaimer, the term of this patent is extended or adjusted under 35 U.S.C. 154(b) by 37 days.

(21) Appl. No.: 09/725,224

(22) Filed: Nov. 29, 2000

(51) Int. Cl.⁷ .............................................. G01R 29/12
(52) U.S. Cl. ...................... 324/458; 324/457; 324/72; 324/72.5
(58) Field of Search ................. 329/458, 457, 329/452, 72, 72.5

(56) References Cited

U.S. PATENT DOCUMENTS

| | | | |
|---|---|---|---|
| 4,205,267 A | | 5/1980 | Williams |
| 4,330,749 A | * | 5/1982 | Eda et al. ................... 324/457 |
| 4,804,922 A | * | 2/1989 | Somentani et al. .......... 324/457 |
| 4,868,907 A | * | 9/1989 | Folkins ....................... 323/231 |
| 4,928,057 A | * | 5/1990 | Williams ..................... 324/72 |
| 4,973,910 A | * | 11/1990 | Wilson ........................ 324/457 |
| 5,204,636 A | | 4/1993 | Werner, Jr. et al. |
| 5,212,451 A | | 5/1993 | Werner, Jr. |
| 5,270,660 A | | 12/1993 | Werner, Jr. et al. |
| 5,323,115 A | * | 6/1994 | Werner, Jr. .................. 324/457 |
| 5,498,974 A | * | 3/1996 | Verkuil et al. .............. 324/767 |
| 5,557,195 A | * | 9/1996 | Schrimpf et al. ............ 324/72 |
| 5,786,722 A | | 7/1998 | Buhler et al. |

\* cited by examiner

Primary Examiner—N. Le
Assistant Examiner—T. R. Sundaram
(74) Attorney, Agent, or Firm—Oliff & Berridge, PLC

(57) ABSTRACT

An electrostatic voltmeter (ESV) and a method thereof provides an electrical signal proportional to an electrostatic potential. The ESV includes a high voltage input section that receives a high voltage signal representative of an electrostatic potential. The high voltage signal input section then generates a current signal representative of the electrostatic potential. The current signal is applied to a control and sensing circuit. A high voltage current source is connected between the high voltage input section and a high voltage potential. The high voltage current source acts as an active load for the control and sensing circuit. A voltage level determining section is connected to a node between the high voltage input section and the high voltage current source for providing an electrical signal proportional to the electrostatic potential. The EVS disclosed herein is particularly useful in measuring electrostatic potential of a photoreceptor to control imaging in an electrophotographic imaging system.

22 Claims, 3 Drawing Sheets

ELECTROSTATIC VOLTMETER WITH CURRENT SOURCE LOAD

CROSS-REFERENCE TO RELATED PATENTS

This invention is related to U.S. Pat. No. 5,323,115 entitled "Electrostatic Voltmeter Producing A Low Voltage Output" by Werner, Jr., U.S. Pat. No. 5,270,660 entitled "Electrostatic Voltmeter Employing High Voltage Integrated Circuit Devices" by Werner, Jr. et al., and U.S. Pat. No. 5,212,451 entitled "Single Balanced Beam Electrostatic Voltmeter Modulator" by Werner, Jr., each of which is incorporated herein.

FIELD OF THE INVENTION

The invention relates generally to the measurement of electrostatic potentials, but more specifically to an electrostatic voltmeter having a current source load working in a high voltage environment.

BACKGROUND OF THE INVENTION

In the past, probes and sensing circuits have not been as accurate as they could have been. Prior systems employed passive load devices to measure electrostatic potential and were disadvantageous because of insufficient current to charge stray capacitances when a switching transistor was turned off. Another disadvantage is that a rather complex mirror system was required to measure the electrostatic potential.

A device constructed according to one embodiment of the present invention is capable of measuring electrostatic potentials with insignificant current flow. Generally, such a device includes a probe working in conjunction with a circuit that receives signals from the probe and produces an output signal. The output signal, indicative of an electrostatic potential, may be used to drive an indicator or to control a process as a function of the measured electrostatic potential. Thus, the present invention may be used in the printing arts and, more particularly, in an electrophotographic reproduction system to control a xerographic process. Electrostatic voltmeters, or ESVs as they are called, are particularly well suited for measuring the surface charge potential of a photoreceptor which, in turn, allows automated adjustment of machine characteristics to achieve a high quality reprographic output.

SUMMARY OF THE INVENTION

It is a general object of the present invention to provide an ESV and method thereof that generates an electrical signal representing an electrostatic potential of an object.

To achieve this and other objects, the present invention provides an ESV having a probe and a sensing circuit that provides an electrical signal proportional to a measured electrostatic potential. The circuit comprises a high voltage input section that is subjected to an electrostatic potential to be measured. The high voltage input section generates a first signal representative of the electrostatic potential. The circuit further includes a high voltage current source connected between the high voltage input section and a high voltage potential. A voltage level determining section is connected to a node between the high voltage input section and the high voltage current source to provide an electrical signal that is proportional to the electrostatic potential.

According to another aspect of the present invention, an apparatus that provides an electrical signal proportional to an electrostatic potential comprises a high voltage current source load, which is active rather than passive. A drain circuit of the high voltage current source load connects to sensor circuitry. A source circuit of the high voltage current source load connects to a high voltage potential. A gate circuit of the high voltage current source load connects to a suitable biasing circuit to set the drain current in a high voltage MOSFET. A voltage level-determining device connects to a node between the sensor circuitry and the source circuit for providing an electrical signal that is proportional to the electrostatic potential being measured.

According to yet another aspect of the present invention, an apparatus for providing an electrical signal proportional to an electrostatic potential comprises an active load connected to a sensor circuit. The active load includes a drain circuit connected to the sensor circuitry, a source circuit connected to a high voltage potential, and a gate circuit connected to a high voltage power supply regulator. A voltage level-determining device is connected to a node between the sensor circuit and the source circuit for providing an electrical signal that is proportional to an electrostatic potential.

In addition, the invention includes a method of measuring the electrostatic potential of an object. The method includes the steps of placing a probe at or in the vicinity of an object having an electrostatic potential on the surface thereof, and generating a first signal that is representative of the electrostatic potential. The method includes applying the first signal to an input of a sensor circuit for controlling the current flow within. The method further includes connecting an active load between the sensor circuit and a high voltage potential. Finally, the method uses a voltage level-determining device that is connected to a node between the sensor circuit and the active load to provide an electrical signal that is proportional to the electrostatic potential.

Other objects, features, and advantages of the present invention will become apparent when considered in conjunction with the accompanied drawings. The invention, though, is pointed out with particularity by the appended claims.

DESCRIPTION OF ILLUSTRATIVE EMBODIMENTS

Figure 1:
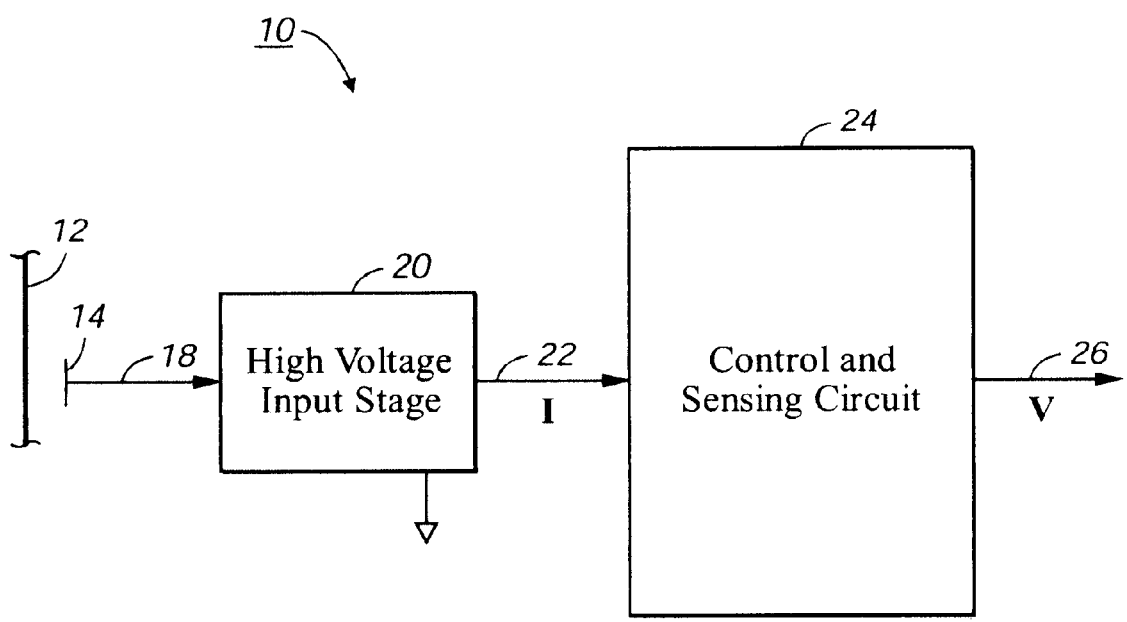
FIG. 1 illustrates an ESV in accordance with a preferred embodiment of the present invention.

FIG. 1 illustrates an electrostatic voltmeter (ESV) 10 according to an embodiment of the present invention. The ESV 10 generates a low voltage electrical signal V in response to a signal from a sensing electrode 14, which lies in proximity to a charged surface 12 under measurement. Surface 12, for example, is a photoreceptor in a xerographic reproduction machine and has an electrostatic charge. During operation of the machine, it is desired to measure the potential of surface 12 in order to control the imaging process.

Sensing electrode 14, when occluded in a continuous manner such as by a vibrating chopper or tuning fork, supplies an input signal to input node 18 as a varying voltage or current signal that may be used to determine the electrostatic potential on surface 12. A high-voltage input stage 20 receives the input signal from input node 18 to produce a current signal. Subsequently, the current signal is passed to a control and signal processing circuit 24 where it is converted to the low voltage electrical signal V. The low voltage electrical signal is proportional to the electrostatic potential on surface 12.

Figure 2:
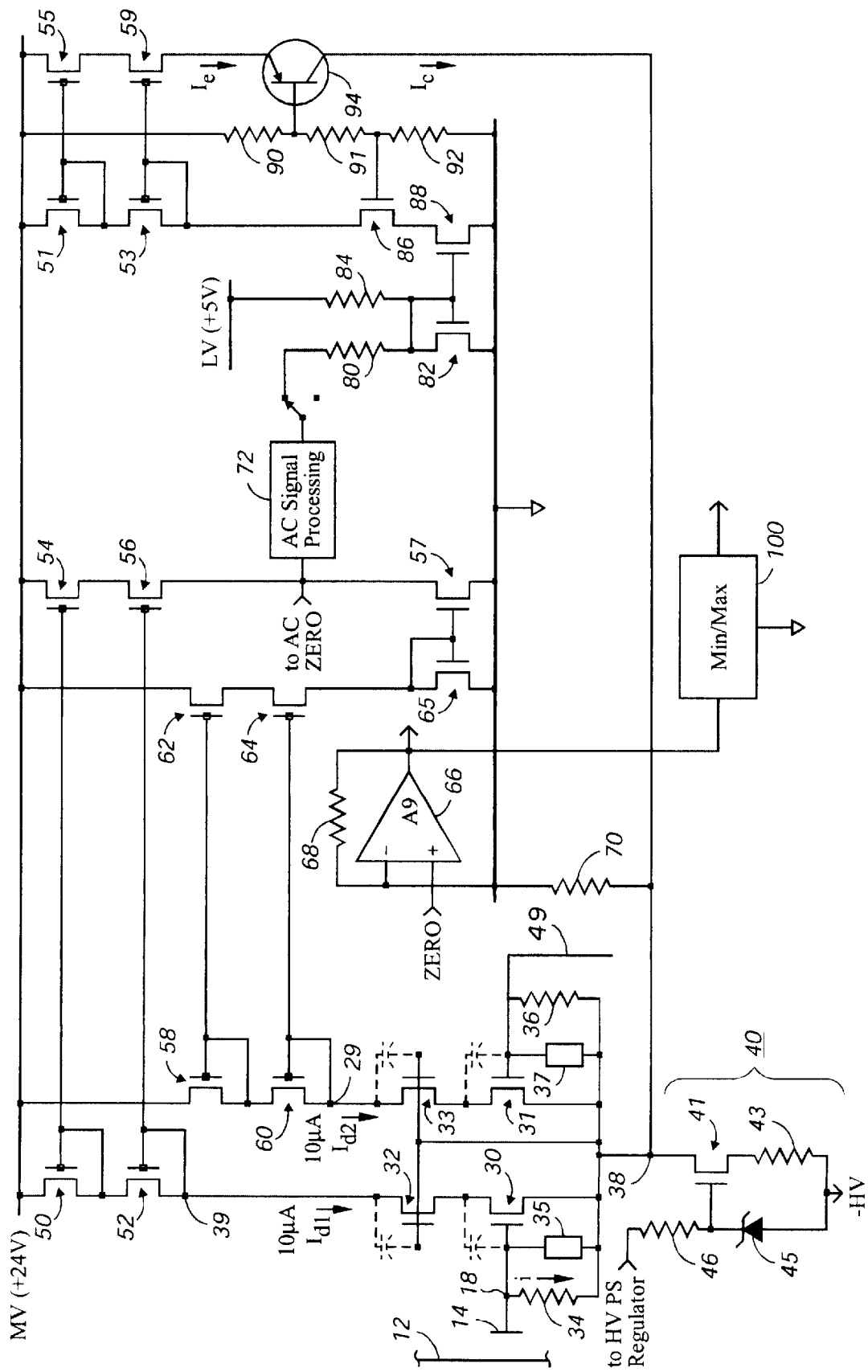
FIG. 2 is an electrical schematic of the ESV in accordance with an embodiment of the present invention.

FIG. 2 shows the ESV 10 of FIG. 1 in greater detail. A gate of an NMOS field effect transistor 30 receives a signal indicative of the potential in sensing probe 14 which, due to its proximity to surface 12 of an electrostatically charged object, is capacitively coupled to the surface 12. Transistors 30 and 32 form a cascode high-voltage depletion-mode NMOS driver that operates in the range of about 1700 volts. A protection device 35, e.g. zener diode, is connected between the gate of transistor 30 and a junction 38. The protection device 35 can withstand an electrostatic discharge voltage of approximately 2 KV and serves to protect the transistor 30 from overvoltage damage.

To occlude or modulate the signal of sensing electrode 14, a modulator (not shown) or similar mechanism either vibrates or occludes the sensor electrode 14. Numerous methods are known to achieve the modulation of capacitive couplings. For example, the single-beam modulator described in U.S. Pat. No. 5,212,451 by Werner, the contents of which are incorporated herein by reference, provides suitable modulation of the signal produced by sensing electrode 14.

Because transistor 30 is slightly in depletion mode when the gate-to-source voltage $V_{gs}$ is approximately equal to zero volts, transistor 30 is active because of the small amount of current passing through it. Thus, the modulation of the signal at the gate of transistor 30 also modulates the current through the source-to-drain path of transistor 30. More specifically, transistor 30 has a nominal drain-to-source DC current $I_{d1}$, of approximately ten microamps that flows through node 39. Variations in voltage in the input node 18, which is connected the gate of transistor 30, impress an AC component in the current $I_{d1}$, that flows through node 39.

More specifically, Q=CV, wherein C is the capacitance between electrode 14 and surface 12, V is the voltage between electrode 14 and surface 12, and Q is the charge between detector electrode 14 and surface 12. A current i, flowing through a 20 megaohm resistor 34 to produce a gate-to-source voltage $V_{gs}$ on transistor 30, can be expressed as:

$i=(dQ/dt)=V(dC/dt)+C(dV/dt).$

The dC/dt term is a function of the modulation of the occluded capacitive coupling described above.

An AC signal processing circuitry 72 processes the AC component of the current signal $I_{d1}$ that flows through node 39, by amplifying, demodulating, and integrating the AC component of the signal. The AC component reflects the modulation of the signal received by sensing electrode 14 and the voltage difference between electrode 14 and surface 12. The AC signal processing circuitry 72 effects the supply of a processed DC current signal to the emitter of a pnp transistor 94 via a level shifting circuit (described hereafter). Transistor 94 supplies its collector current $I_c$ to junction 38 to provide DC current feedback to node 38 where it is added to the currents from the high voltage input stage (described hereafter) and high voltage current source (described hereafter) thereby generating a voltage across resistor 70 (described hereafter) and causing the source voltage of transistor 30 to track the voltage on surface 12.

To extract the AC component from the combined DC and AC signals at node 39 and to supply the input of circuitry 72 with the AC signal, ESV 10 subtracts a DC current signal $I_{d2}$ flowing through a node 29 from the current signal $I_{d1}$ flowing through node 39. A subcircuit, including NMOS field effect transistor 31, determines the DC current signal $I_{d1}$ flowing through node 29. The cascode circuit made from low voltage depletion transistor 30 and high voltage transistor 32 along with the cascode circuit made from low voltage depletion transistor 31 and high voltage transistor 33 form a closely matched integrated differential input stage that operates in the 1700 volt range. Protection devices 35 and 37 are zener diodes are also integrated into the input stage and will withstand an electrostatic discharge voltage of approximately 2 KV. Resistor 36 is a 20-megaohm resistor and is connected between the gate circuit of transistor 31 and junction 38. It is used to balance out any DC gate voltage due to any gate current in transistor 30 passing through resistor 35 with an equivalent DC gate voltage on transistor 31 across R36. Transistor 31 has a nominal drain-to-source current $I_{d2}$ of approximately ten microamps.

Transistors 50, 52, 54, and 56 constitute a first current mirror system that generates a current tracking the current that flows through node 39 and onto the input of AC signal processing circuitry 72. Transistors 58, 60, 62, and 64 constitute a second current mirror that generates a current through transistor 65, which tracks the current that flows through node 29. Thus, transistors 65 and 57 effectively subtract the current flow through node 29 from the current flow through node 39. The resulting signal is an AC signal with the DC component removed.

AC signal processing circuitry 72 generates an output signal to a control pnp transistor 94 via a level shift circuit. The level shift circuit comprises resistors (80, 84, 91, and 92) and MOSFET transistors (51, 53, 55, 59, 82, 86, and 88).

The level shifting circuit translates the output of AC signal processing circuitry 72, which is in the range of 0–5 volts, to a current signal in the range of 20–150 microamps. The output of the level shifting circuit is applied to the emitter of pnp transistor 94. The base of transistor 94 is held at a constant voltage so that by controlling the current supplied to the emitter of transistor 94 a current is supplied to junction 38.

In accordance with an embodiment of the invention, an active current source load 40 is also connected to junction 38. The active current source load 40 comprises a MOSFET 41 having its "drain" terminal connected to the high voltage input stage, the "source" terminal connected to a negative high voltage source (−HV) via a resistor 43, and the "gate" terminal connected to a high voltage power supply regulator via a resistor 46. The active current source load 40 further includes a zener diode 45 connected between the gate of MOSFET 41 and the high voltage source −HV and a resistor 46 connected between the gate of MOSFET 41 and ground potential. The negative high voltage source is preferably at −1200 volts.

A voltage level determining section is connected to junction 38 between the high voltage sensor circuit section, including MOSFET 30, the active current source load 40, and the collector of high voltage transistor 94. The voltage level determining section comprises an operational amplifier 66 that is connected to the junction 38 via a resistor 70. Resistor 70 is also the resistor load which the sum of the currents at junction 38 goes through in order to generate the feedback voltage at junction 38. With the use of a feedback resistor 68, the operational amplifier 66 generates a low DC voltage indicative of the electrostatic surface potential.

The low DC voltage may then be used as input for a display device (not shown) to indicate the voltage level on surface 12, or used to control an electrostatic process as a function of the measured electrostatic potential. The output of the operational amplifier 66 also supplies a minimum and maximum determining device 100. The minimum and maximum determining device 100 tracks and hold either the minimum or maximum values as supplied thereto by the operational amplifier 66.

When the ESV 10 is viewed as a whole device, certain components can be considered as being part of a control circuit. The control section includes the first pair of MOSFETs 50/52, second pair of MOSFETs 58/60, third pair of MOSFETs 54/56, fourth pair of MOSFETs 62/64, fifth pair of MOSFETs 51/53, sixth pair of MOSFETs 55/59, seventh pair of MOSFETs 57/65, MOSFETs 82/86/88, circuitry 72, and pnp transistor 94. The high voltage current source 40 acts as a load for transistor 94 by causing a current $I_c$ to flow through transistor 94 and into MOSFET 41.

Figure 3:
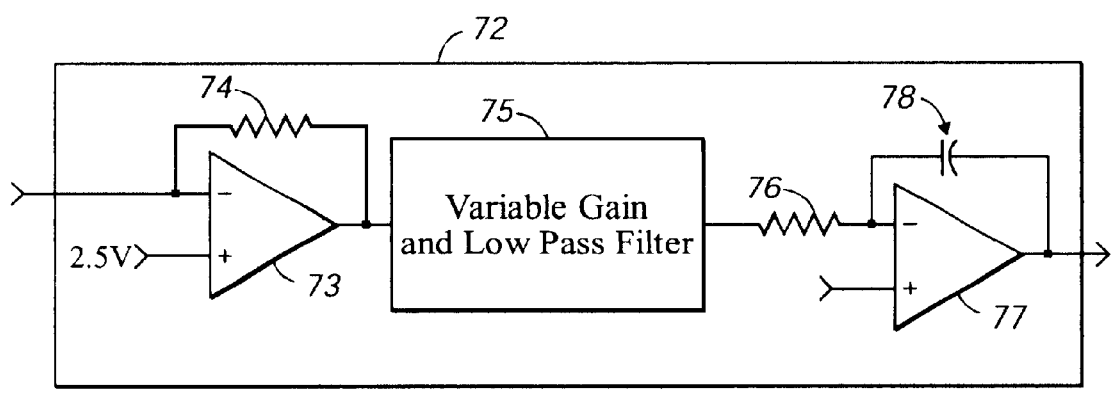
FIG. 3 illustrates a portion of the schematic of FIG. 2 in more detail.

FIG. 3 shows an exemplary AC signal processing circuitry 72 in more detail. The AC signal processing circuitry 72 includes a buffer circuit having an operational amplifier 73 and a feedback resistor 74, a variable gain and low pass filter circuit 75, and an integrator including resistor 76, operation amplifier 77, and capacitor 78. The AC signal processing circuitry 72 may include a dynamically limited amplifier similar to that disclosed in the U.S. Pat. No. 5,204,636 for a "Dynamic Limiting Circuit for an Amplifier," by Werner et al., the contents of which are incorporated by reference.

The illustrated embodiment provides a device capable of measuring electrostatic potentials with insignificant current flow into the ESV. The illustrated embodiment includes an application specific integrated circuit (ASIC) ESV that uses a high voltage current source as a load for a high voltage input stage. The high voltage current source further serves as a load for a control pnp transistor to resemble a transconductance amplifier output stage. One advantage of the invention is that the current available from the current source load is constant and independent of the voltage across it.

Another advantage is that the load is active to facilitate charging of stray capacitances in the system, and more current can be programmed into an "output stage". When the output is driven positive, the integrator stage of FIG. 3 supplies a voltage output to the voltage-to-current conversion stage including resistor 80 and the current mirror system consisting of transistors 82, 88,51, 53, 55, and 59, which supplies the current needed to the emitter of high voltage PNP transistor 94 so that the collector of control transistor 94 supplies the required current to effect a current supply to resistor load 70 to cause junction 38 to go positive. When the output is driven negative, the integrator stage supplies a voltage which decreases the current from PNP transistor 94 and the high voltage current source pulls the output voltage negative. Since the current from the high voltage current source is independent of the voltage across it over the range of 0 to −1 KV, enough current is available over the full output range to charge stray capacitances. Since the current from transistor 94 has been cut back, the available current to charge the stray capacitances actually increases as the source terminal approaches the negative HV power supply.

Yet another advantage of the invention is that there is sufficient current available, even near the HV negative rail, to use two simple resistors and a single operational amplifier configuration to directly measure the high voltage output.

Additional advantages and modifications will readily occur to those skilled in the art. The invention in its broader aspects is therefore not limited to the specific details, circuit components or the values thereof, representative apparatus, or illustrative embodiments shown and described. Accordingly, departures may be made from such details without departing from the spirit and the scope of the invention. The invention is defined in the appended claims.

I claim:

1. An apparatus that measures an electrostatic potential comprising:
    a sensing electrode that senses the electrostatic potential and that produces a sensor signal, the sensor signal having an alternating portion;
    a filter circuit that isolates the alternating portion from the sensor signal;
    a conversion circuit that produces a shift signal based on the alternating portion;
    an active source load connected to a negative high voltage supply at a first end and to the sensor signal and the shift signal at a second end; and
    a voltage level determining circuit that receives the shift signal across a first resistor and that generates an indicator signal indicative of the electrostatic potential.

2. The apparatus according to claim 1, wherein:
    the sensor signal is a sensor current;
    the shift signal is a shift current; and
    the indicator signal is an indicator voltage.

3. The apparatus according to claim 1, wherein the active source load comprises:
    a first transistor having a first source connected to the second end, a first drain connected to the negative high voltage supply, and a first gate connected to a power supply regulator and to the negative high voltage supply; and
    a first Zener diode between the first gate and the negative high voltage supply.

4. The apparatus according to claim 3, wherein the active source load comprises:
    a second resistor between the first drain and the high voltage source; and
    a third resistor between the first gate and the power supply regulator.

5. An apparatus that measures an electrostatic potential comprising:
    a sensing electrode that senses the electrostatic potential and produces a sensor signal, the sensor signal having an alternating portion;
    a filter circuit that isolates the alternating portion from the sensor signal;
    a conversion circuit that produces a shift signal based on the alternating portion;
    a source load connected to a negative high voltage supply at a first end and to the sensor signal and the shift signal at a second end, wherein the source load includes a first transistor having a first source connected to the second end, a first drain connected to the negative high voltage supply, and a first gate connected to a power supply regulator; and
    a voltage level determining circuit that generates an indicator signal indicative of the electrostatic potential based on the shift signal.

6. The apparatus according to claim 5, wherein the source load comprises:
    a first resistor connected between the voltage level determining circuit and the second end;
    a second resistor connected between the first drain and the high voltage source;

a third resistor connected between the first gate and the power supply regulator; and a first Zener diode between the first gate and the negative high voltage supply.

7. The apparatus according to claim 5, wherein the conversion circuit comprises:

a signal processing circuit that receives the alternating portion and that generates a process signal; and a shift circuit that converts the process signal into the shift signal.

8. The apparatus according to claim 7, wherein the signal processing circuit has variable gain and low frequency pass.

9. The apparatus according to claim 8, wherein the signal processing circuit comprises:

a first operational amplifier having a first non-inverting input terminal at a very low voltage, a first inverting input terminal that receives the alternating portion, and a first output;

a fourth resistor disposed between the first inverting input terminal and the first opamp output;

a signal filter having a filter input connected to the first opamp output and a filter output;

a fifth resistor connected to the signal filter at the filter output; and a second operational amplifier having a second inverting input terminal and a second output to provide the process signal; and a capacitor connected to the second inverting input terminal and the second opamp output.

10. The apparatus according to claim 7, wherein the shift circuit includes a diode having a diode source connected to a current source, a diode drain connected to the second end and a diode gate connected to the signal processing circuit.

11. The apparatus according to claim 10, wherein the shift circuit comprises:

a sixth resistor that receives the process signal;

a second transistor having a second source connected to the sixth resistor, a second drain connected to the ground potential, and a second gate connected to the second source;

a seventh resistor connected to the second gate and a low voltage;

a third transistor having a third source, a third drain connected to the ground potential, and a third gate connected to the second gate;

a fourth transistor having a fourth source, a fourth drain connected to the third source, and a fourth gate;

an eighth resistor connected to the fourth gate and the ground potential;

a fifth transistor having a fifth source connected to a medium voltage, a fifth drain, and a fifth gate connected to the fifth drain;

a sixth transistor having a sixth source connected to the fifth drain, a sixth drain connected to the fourth source, and a sixth gate connected to the sixth drain;

a seventh transistor having a seventh source connected to the medium voltage, a seventh drain, and a seventh gate connected to the fifth gate;

an eighth transistor having an eighth source connected to the sixth drain, an eighth drain connected to the diode, and an eighth gate connected to the sixth gate;

a ninth resistor connected to the fourth gate and the diode gate; and a tenth resistor connected to the diode gate and the medium voltage.

12. The apparatus according to claim 9, wherein the process signal ranges between 0 V and +5 V.

13. The apparatus according to claim 12, wherein the shift signal ranges between 20 $\mu$A and 150 $\mu$A.

14. The apparatus according to claim 5, further comprising:

a sensor circuit that receives the sensor signal from the sensing electrode and that transmits the sensor signal to the filter circuit.

15. The apparatus according to claim 14, wherein the sensor circuit comprises:

a ninth transistor having a ninth gate for receiving the sensor signal; and a tenth transistor connected to the ninth transistor and the filter circuit.

16. The apparatus according to claim 15, wherein the sensor circuit comprises:

an eleventh resistor connected to the sensor and to the ninth gate; and a second Zener diode connected in parallel with the eleventh resistor between the sensor and the ninth gate.

17. The apparatus according to claim 14, wherein the sensor circuit comprises:

a ninth transistor having a ninth gate that receives the sensor signal;

an eleventh resistor connected to the sensor and the ninth gate;

a second Zener diode connected in parallel with the ninth resistor to the sensor and to the ninth gate;

a tenth transistor having a tenth gate and a transistor terminal;

a twelth resistor connected to the tenth gate and the transistor terminal;

a third Zener diode connected in parallel with the twelth resistor to the tenth gate and to the transistor terminal;

an eleventh transistor connected to the ninth transistor and the alternating portion mirror; and a twelfth transistor connected to the tenth transistor and the direct current mirror.

18. The apparatus according to claim 5, wherein the filter circuit comprises:

a direct portion mirror that produces a direct current; and an alternating portion mirror that subtracts the direct current from the sensor signal and that produces the alternating portion.

19. The apparatus according to claim 16, wherein the alternating portion mirror comprises:

a thirteenth transistor having a thirteenth source, a thirteenth drain and a thirteenth gate, the thirteenth source connected to a medium voltage, the thirteenth gate connected to the thirteenth drain;

a fourteenth transistor having a fourteenth source, a fourteenth drain and a fourteenth gate, the fourteenth source connected to the thirteenth drain, the fourteenth gate connected to the fourteenth drain, the fourteenth drain connected to the signal processor;

a fifteenth transistor having a fifteenth source, a fifteenth drain and a fifteenth gate, the fifteenth source connected to the medium voltage, the fifteenth gate connected to the thirteenth gate; and a sixteenth transistor having a sixteenth source, a sixteenth drain and a sixteenth gate, the sixteenth source connected to the fifteenth drain, the sixteenth gate connected to the fourteenth gate, the sixteenth drain connected to the signal processor.

20. The apparatus according to claim 19, wherein the direct portion mirror comprises:
- a seventeenth transistor having a seventeenth source, a seventeenth drain and a seventeenth gate, the seventeenth source connected to the medium voltage, the seventeenth gate connected to the seventeenth drain;
- a eighteenth transistor having a eighteenth source, a eighteenth drain and a eighteenth gate, the eighteenth source connected to the seventeenth drain, the eighteenth gate connected to the eighteenth drain;
- a nineteenth transistor having a nineteenth source, a nineteenth drain and a nineteenth gate, the nineteenth source connected to the medium voltage, the nineteenth gate connected to the seventeenth gate; and
- a twentieth transistor having a twentieth source, a twentieth drain and a twentieth gate, the twentieth source connected to the nineteenth drain, the twentieth gate connected to the eighteenth gate, and the twentieth drain connected to a ground potential.

21. The apparatus according to claim 5, wherein the voltage level determining circuit comprises:
- a third operational amplifier having a third non-inverting input terminal connected to a ground potential, a third inverting input terminal connected to a third opamp output and to the second end through the first resistor; and
- a thirteenth resistor connected to the third inverting input terminal and the third opamp output.

22. The apparatus according to claim 21, wherein the third output is connected to a maximum/minimum determiner.

* * * * *